(12) United States Patent
Eisele et al.

(10) Patent No.: US 7,040,381 B2
(45) Date of Patent: May 9, 2006

(54) COOLING DEVICE

(75) Inventors: Ronald Eisele, Surendorf (DE); Klaus Kristen Olesen, Soenderborg (DE)

(73) Assignee: Danfoss Silicon Power GmbH, Schleswig (DE)

( * ) Notice: Subject to any disclaimer, the term of this patent is extended or adjusted under 35 U.S.C. 154(b) by 0 days.

(21) Appl. No.: 10/502,146

(22) PCT Filed: Jan. 22, 2003

(86) PCT No.: PCT/DK03/00038

§ 371 (c)(1),
(2), (4) Date: Jul. 20, 2004

(87) PCT Pub. No.: WO03/063240

PCT Pub. Date: Jul. 31, 2003

(65) Prior Publication Data

US 2005/0143000 A1    Jun. 30, 2005

(30) Foreign Application Priority Data

Jan. 26, 2002    (EP)    .................................. 02001846

(51) Int. Cl.
*H05K 7/20*    (2006.01)
(52) U.S. Cl. ...................... 165/80.4; 257/714; 361/689
(58) Field of Classification Search ................ 361/689, 361/690, 692, 693; 165/80.4, 80.2; 257/714
See application file for complete search history.

(56) References Cited

U.S. PATENT DOCUMENTS

| 4,138,692 | A | * | 2/1979  | Meeker et al.    | 257/697 |
| 5,166,863 | A | * | 11/1992 | Shmunis          | 361/699 |
| 5,239,443 | A |   | 8/1993  | Fahey et al.     |         |
| 5,269,372 | A |   | 12/1993 | Chu et al.       |         |
| 5,309,319 | A | * | 5/1994  | Messina          | 361/699 |
| 5,365,400 | A | * | 11/1994 | Ashiwake et al.  | 361/752 |
| 5,436,501 | A | * | 7/1995  | Ikeda            | 257/714 |
| 5,959,351 | A | * | 9/1999  | Sasaki et al.    | 257/714 |

FOREIGN PATENT DOCUMENTS

| FR | A-2 715 773 | 8/1995 |
| WO | WO 98/44307 | 10/1998 |

* cited by examiner

*Primary Examiner*—Harold Joyce
(74) *Attorney, Agent, or Firm*—McCormick, Paulding & Huber LLP (57) ABSTRACT

A cooling device comprising a heat-conducting cooling plate on the side of the electronic power components to be cooled and a platelike cooling fluid distributing device. The distributing device has cooling fluid outlets on the side facing the cooling plate, said outlets being arranged at a distance from and pointing towards the cooling plate. The distributing device also comprises at least one drain outlet for the cooling fluid. The cooling device comprises a first plate in which outlets and a plurality of drain outlets are evenly distributed and a second plate and a third plate which are superimposed, wherein two plates define a feed channel that is connected to all outlets and a drain channel that is connected to all drain outlets.

15 Claims, 10 Drawing Sheets

COOLING DEVICE

CROSS-REFERENCE TO RELATED APPLICATIONS

This application is entitled to the benefit of and incorporates by reference essential subject matter disclosed in International Patent Application No. PCT/DK03/00038 filed on Jan. 22, 2003 and European Application No. 02001846.1 filed on Jan. 26, 2002.

FIELD OF THE INVENTION

The invention concerns a cooling device, especially for electronic power components, with a heat conducting cooling plate for the component or components to be cooled and a platelike distributing device arranged in the vicinity of the cooling plate for a cooling fluid, which distributing device on its side facing the cooling plate has a plurality of outlet openings for the cooling fluid, arranged in spaced relation to the cooling plate and directed toward the cooling plate, and at least one drain opening for the cooling fluid.

BACKGROUND OF THE INVENTION

In a known cooling device of this kind (FR-A-2 715 773) a cooling fluid is directed onto the cooling plate from outlet openings of the distributing device acting as jets. On the outside of the cooling plate a power component is arranged and includes several power semiconductor elements. Each of these power semiconductor elements is associated with one of the jets on the underside of the cooling plate. The distributing device is a one-piece plate, into which is formed, by boring, a U-shaped branched feed channel for the cooling fluid. The cooling fluid is drained through a single opening and a bored drain channel in the middle of the cooling plate. The manufacture of the distributing device is difficult, because the bores extending parallel to the plane of the cooling plate can be made only with great difficulty. Since a jet is arranged below each power semiconductor element, the cooling device is suitable only for a specific power component. For other forms of power components a new design must be made. Further, since each power semiconductor element is cooled only by one cooling fluid stream and the cooling fluid is drained through a common opening, relatively large temperature gradients appear at the cooling surfaces of the power semiconductor elements. Also, the jets are all arranged at the outer edge of the space lying between the cooling plate and the distributing plate through which the cooling fluid flows. Therefore, the cooling fluid does not flow symmetrically in all directions from the jets to the central drain openings along and below the power components. Especially along the edges of the distributing plate no flow appears. Consequently, at this place no sufficient heat dissipation is achievable.

The invention has as its object the provision of a cooling device of the aforementioned kind, which is suited for use with different shapes of power components, which provides a uniform cooling over the entire cooling surface of the cooling plate, and insofar as it is used for the cooling of power components is safe for each power component and is simple to manufacture.

SUMMARY OF THE INVENTION

The above-described object is achieved in accordance with the invention in that the distributing device has a first plate in which the outlet opening and a plurality of drain openings are uniformly distributed, a second plate and a third plate, which plates are superimposed and of which plates there are two plates one of which two plates bounds a feed channel connected with all of the outlet openings and one of which two plates bounds a drain channel connected with all of the drain openings.

Because of the plurality of uniformly distributed outlet and drain openings a uniform heat dissipation and cooling of the entire cooling surface of the cooling plate is assured, essentially independently of the shape and number of the power components which may be wanted to be cooled. The same thing applies for a fluid to be cooled, such as gas or a liquid, which stands or comes into contact with the cooling surface of the cooling plate. Since the distributing device is comprised of several sandwiched plates, which bound the feed and drain channels, the manufacture of the distributing device is simple: the fashioning of the channels can take place on a outer side or both outer sides of a plate or of two plates, for example in a corresponding shaping tool. At the same time, as the case may be, in the same shaping tool the necessary outlet and drain openings can be formed in the first plate.

Preferably, it is seen too that the feed channel is connected with the outlet openings by tubular conductors which pass through the drain channel and that the drain openings are directly connected with the drain channel. This construction makes possible in a simple way the distribution of the cooling fluid to the outlet openings and the formation of the drain openings.

Then the second plate can be arranged between the first plate and the third plate while the tubular conductors can be formed as one-piece with the second plate. This makes possible a common manufacture of the tubular conductors and the second plate. The tubular conductors can in a simple way connect with the outlet openings by a plug connection.

It is, however, also possible that the outlet openings can directly connect with the feed channel and that the drain openings are connected with the drain channel by tubular conductors passing through the feed channel. In this case, the second plate can be arranged between the first plate and the third plate, and the tubular conductors can be formed of one-piece with the first plate. Further, the tubular conductors can be connected with holes passing through the second plate by a plug connection.

Preferably, it is seen too that the first plate is received in an opening in a cover plate of a housing which opening is covered by the cooling plate, the second plate is received in an opening in an intermediate plate of the housing and the third plate is formed by a bottom plate of the housing. With this construction the feed channel and the drain channel are bounded in a simple way by the housing plates, with the bottom plate of the housing at the same time bounding the underside of one of the channels.

Alternatively, the third plate can be provided with outlet openings directed toward a second cooling plate, with these outlet openings being connected with the feed channel by tubular conductors passing through the drain channel and the second plate, while the third plate has drain openings leading to the drain channel. In this way the cooling surface of the cooling device is doubled by the addition of only one further plate, namely the second cooling plate.

Preferably, it is seen too that each cooling plate is made of metal and at least the second plate and the third plate as well as the tubular conductors are made of heat insulating thermoplastic plastic material. In this case, the metal plates provide a good heat conductivity and the heat insulating plates and the tubular conductors provide for an opposite heat insulation of the feed and drain channels. The plastic plates and the tubular conductors further allow for a simple manufacturing, for example by injection molding methods.

An advantageous construction can exist in that between the first plate and the second plate a fourth plate is arranged which lies on the first plate and the second plate in which fourth plate a somewhat comb-shaped first aperture laterally bounds the feed channel, that between the second plate and the third plate is arranged a fifth plate which lies on the second plate and the third plate, in which fifth plate a somewhat comb-shaped second aperture laterally bounds the drain channel, that each comb tooth corresponding branch of the first aperture has associated with it at least one group of outlet openings of the first plate, that each tongue of the fourth plate extending between neighboring branches of the first aperture has a group of drain openings each of which register with a drain opening in the first plate and a drain opening in the second plate, and that each group of drain openings of the second plate is associated with a comb tooth corresponding branch of the second aperture. This construction of the cooling device is flat like a plate and is compact. Pronounced tubular conductors can be omitted. Only holes or apertures need to be formed in the plates.

Moreover, in this case it can also be seen to that between the cooling plate and the first plate a sixth plate is arranged which lies on the cooling plate and the first plate, in which sixth plate holes are formed and that through each of these holes at least one of the groups of outlet openings and of the drain openings of the first plate stand in connection with the cooling plate. In these holes, each of which is larger than the total passage surface of at least one group of outlet openings and one group of drain openings in the first plate, the cooling fluid escaping from the outlet openings can uniformly distribute itself over a large area and can come into contact with the cooling plate, so that, if on the outer side of the cooling plate a power component is placed over one of the holes or if a fluid to be cooled is moved along the outer side of the cooling plate a uniform cooling of the thing to be cooled (power component or fluid to be cooled) is assured.

A further development of the construction can exist in that the first aperture is connected with an inlet connector through registering openings in the second, third and fifth plates and in that the second aperture is connected with an outlet connector through a hole formed in the third plate. Consequently, also for the connection of the feed and drain channels with the inlet and outlet connectors only holes in the plates are necessary.

Preferably, the plates are sealingly connected with one another. Instead of a gaseous cooling fluid, such as air, a cooling liquid can then be used without the danger of an injury to the component to be cooled and/or a dirtying by way of an undesired escape of the cooling liquid.

At least the first to the fifth plates can be made of plastic or metal and the cooling plate of metal. Also in the case of this platelike cooling device the plates accordingly can be made in simple ways.

BRIEF DESCRIPTION OF THE DRAWINGS

The invention and its developments are described in more detail in the following by way of the drawings of preferred exemplary embodiments. The drawings are.

DETAILED DESCRIPTION OF THE PREFERRED EMBODIMENTS

The cooling devices according to FIGS. 1–5 include at least a first plate 1, a second plate 2 and a third plate 3, which together form at least one distributing device 4 for a cooling fluid for cooling an electronic power component 5 through a cooling plate 6 of metal. The cooling device serves to simultaneously cool several electronic power components 5, so called power modules, each of which can contain several power semiconductor elements, so called "chips", and which are provided with clamping connections 7. The power components 5 are each fastened to one of the cooling plates 6 (FIG. 2) by screws 8.

Figure 1:
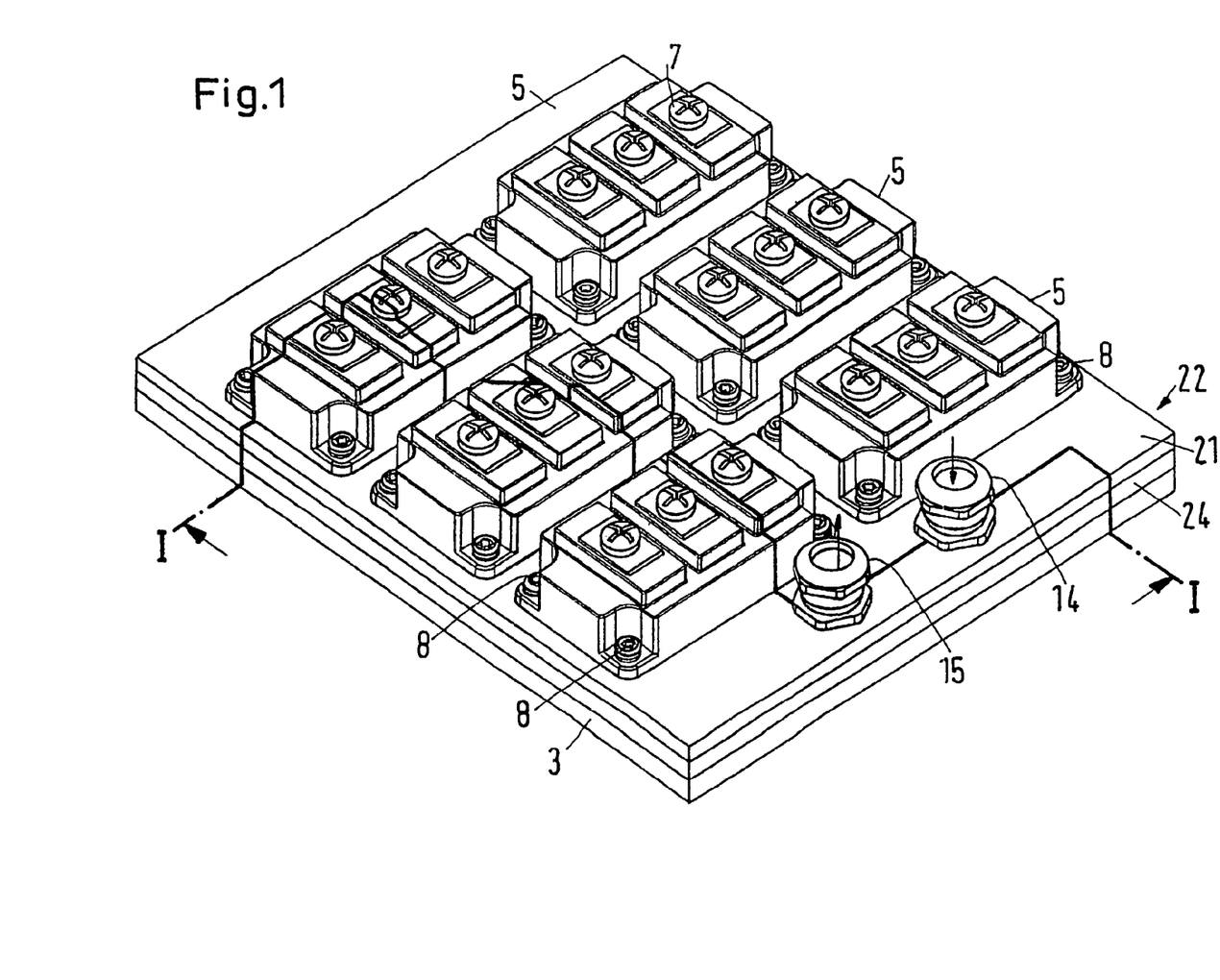
FIG. 1 is a perspective view of a cooling device comprising a first embodiment of the invention, with electronic power components to be cooled applied to it.
Figure 2:
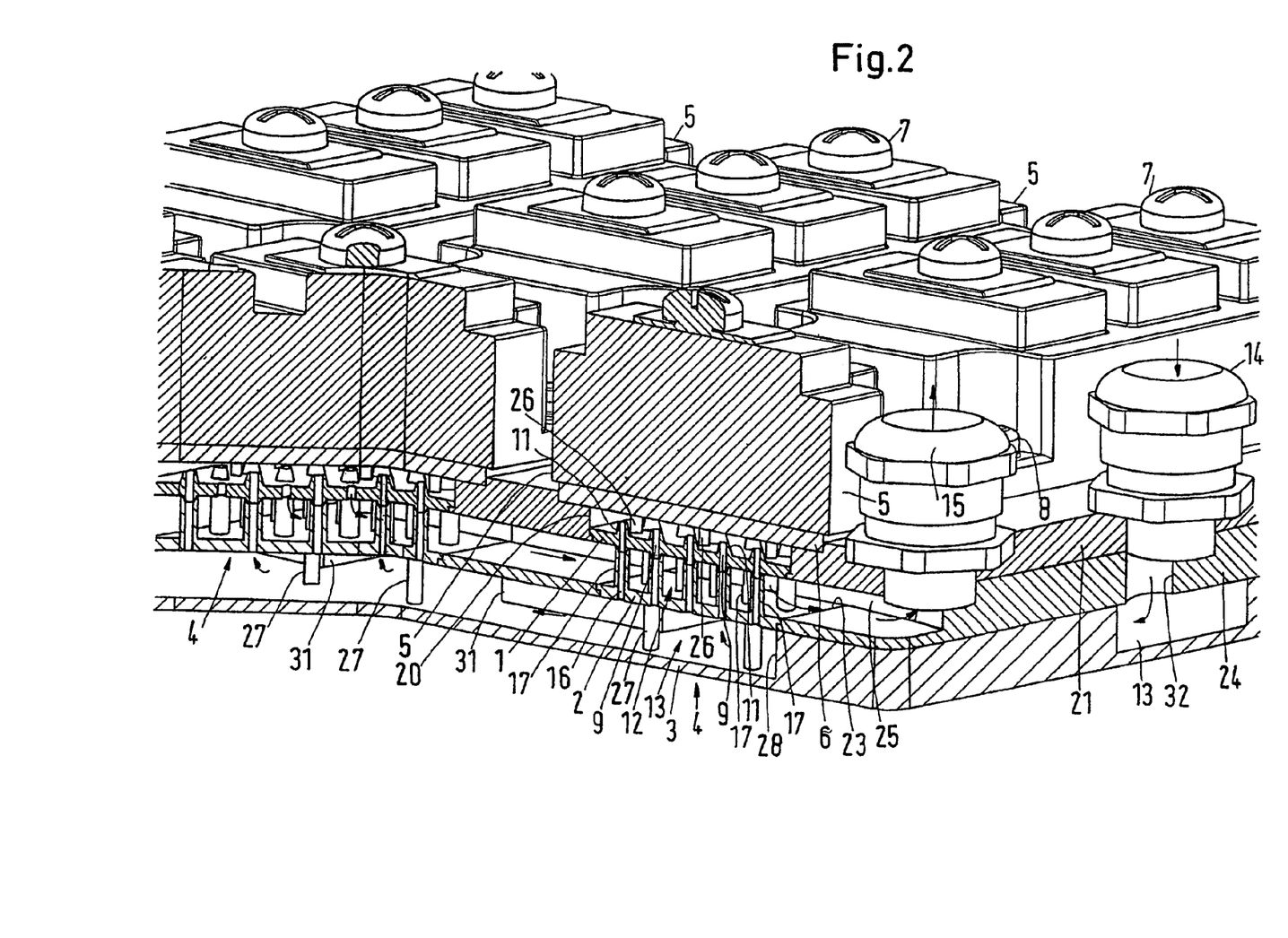
FIG. 2 is a section taken along the line I-I of FIG. 1 in enlarged scale.
Figure 3:
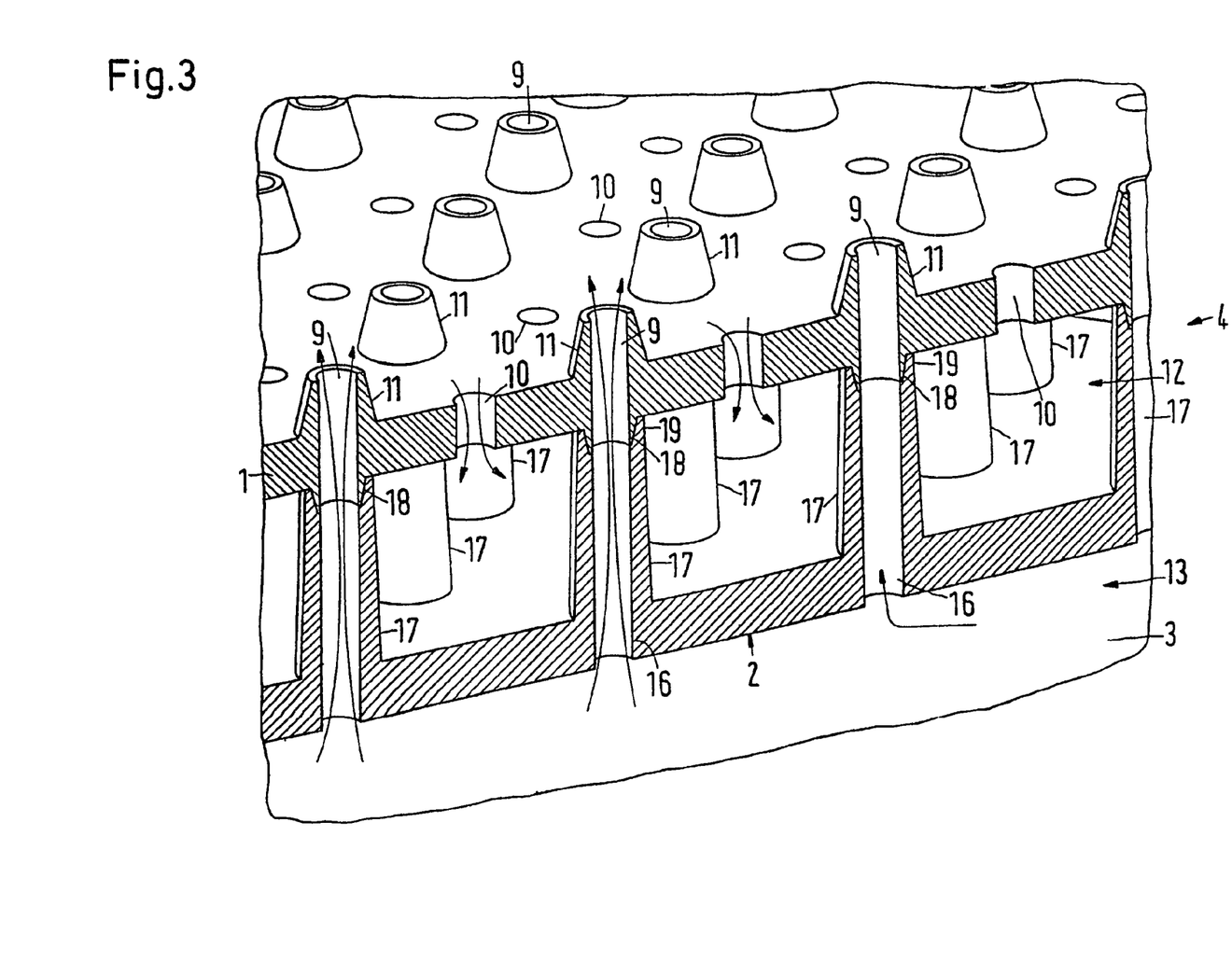
FIG. 3 is an enlarged portion of the cross-section of FIG. 2.
Figure 4:
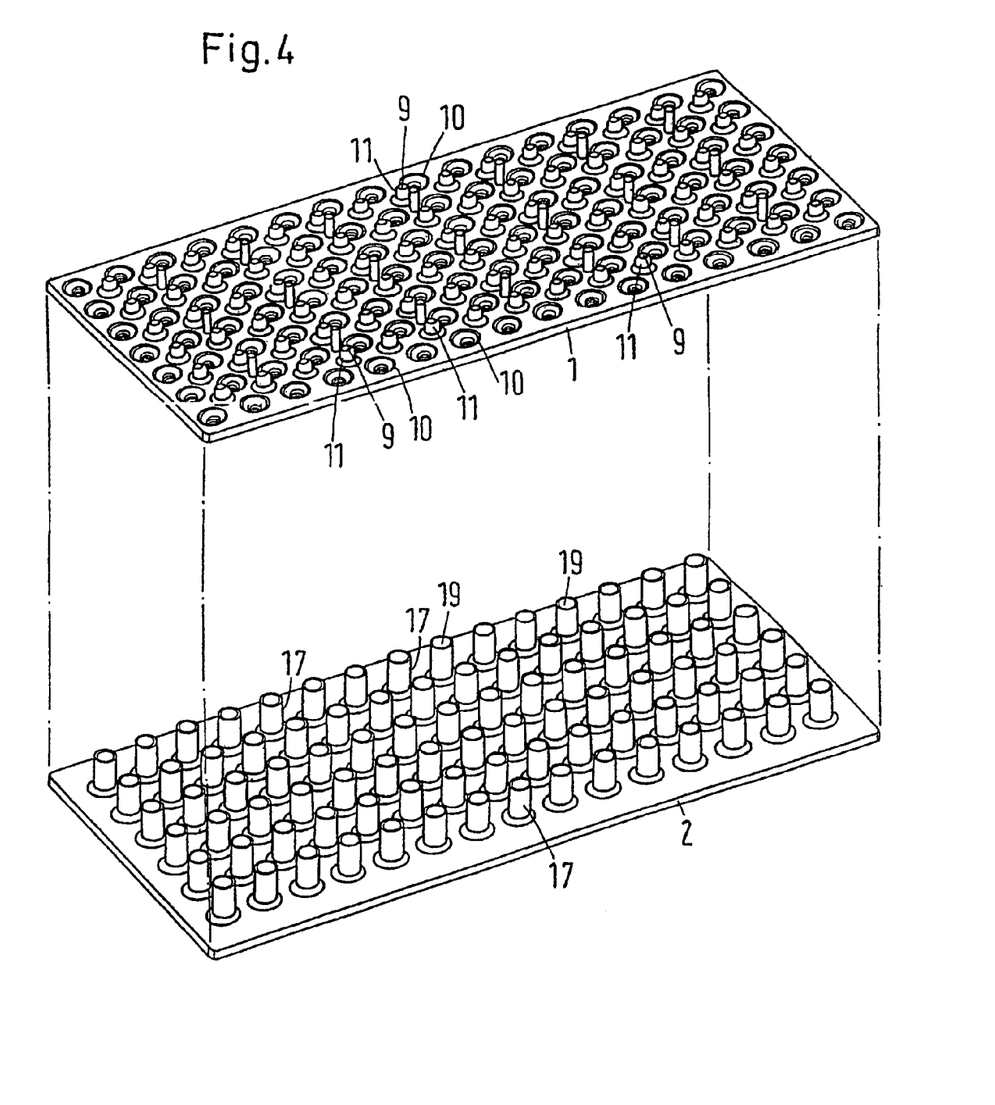
FIG. 4 shows two plates of a cooling fluid distributing device of the cooling device of FIGS. 1 to 3 in a perspective exploded view.

The one plate 1 or each of the several plates 1, has a plurality of outlet or discharge openings 9 and a plurality of drain outlets 10 (FIGS. 3 and 4). The outlet openings 9 are concluded outwardly by cone shaped stubs 11 directed toward the cooling plate 6. The drain outlets 10 are formed as simple bores in the plate 1 and discharge directly into a drain channel 12, which in the situation according to FIGS. 1–3 is bounded upwardly by the plate 1 and downwardly by the plate 2. The second plate 2 defines between itself and the third plate 3 a feed channel 13. The feed channel 13 is connected with an inlet connector 14 for the cooling fluid and the drain channel 12 is connected with an outlet connector 15 for the cooling fluid.

The delivery channel 13 is connected with the outlet openings 9 by a plug connection through openings 16 formed in the plate 2 and tubular conductors 17 formed integrally with the plate 2 and which pass through the drain channel 12 between the plates 2 and 3. Forming this plug connection are outwardly conical connecting pegs 18 formed integrally with the plate 1 on the bottom side of the plate, each of which pegs registers with one of the outlet openings 9 and is inserted into a corresponding inner conical section 19 of the associated tubular conductor 17 and is preferably sealingly fastened therein (FIG. 3), for example by adhesive or welding. As to the sealed connection, this can be omitted if the cooling fluid handled is a gas, for example air, and not a liquid, for example water.

Figure 5:
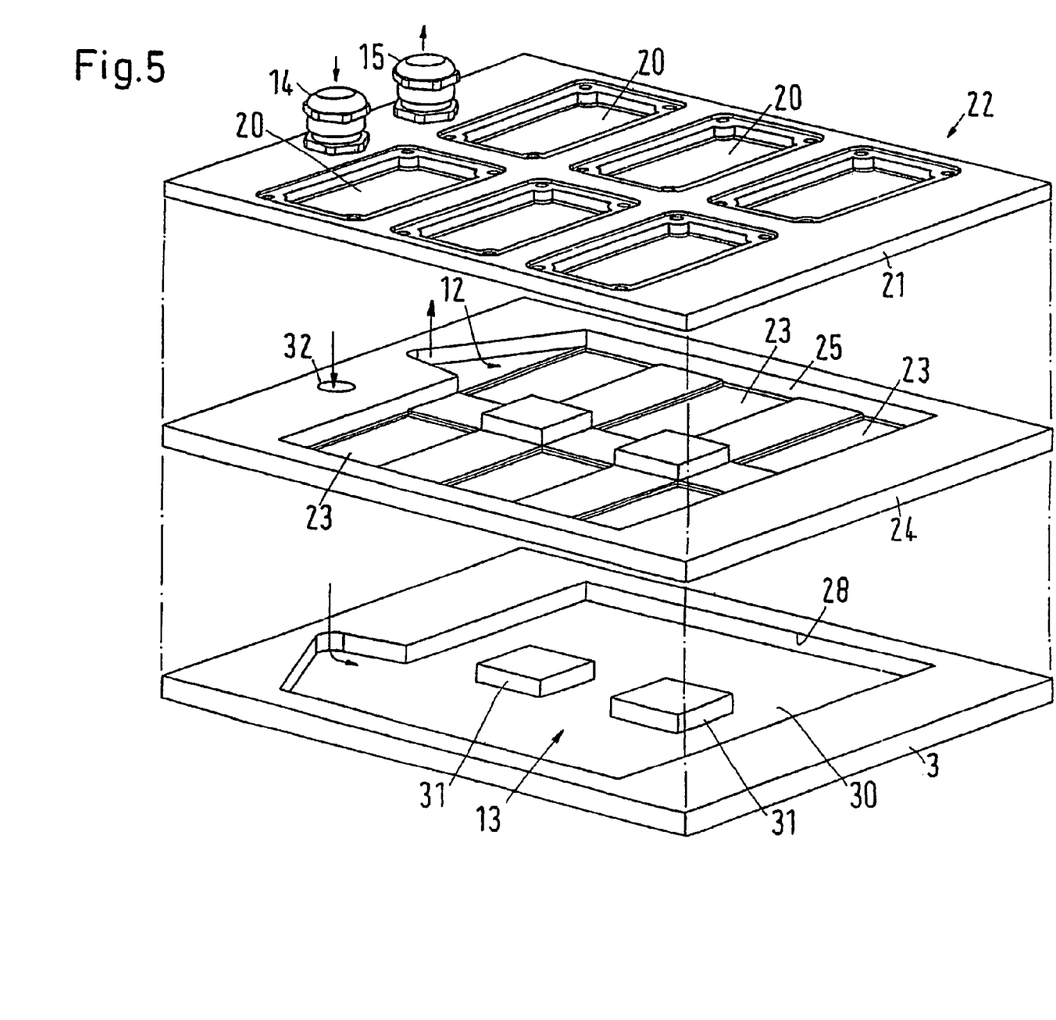
FIG. 5 is a perspective exploded view of housing plates of the cooling device according to FIGS. 1 and 2.

Each first plate 1 is received in an opening 20 of a cover plate 21 of a housing 22, which opening is covered by the cooling plate 6, see especially FIGS. 1, 2, and 5. Each second plate is received in an opening 23 of an intermediate plate 24 of the housing 22, see especially FIGS. 1, 2, and 5. The third plate 3 is formed by a bottom plate of the housing 22. The cover plate 21 thereby defines with the edge of each opening 20 the circumference of the cooling chamber, which is limited upwardly by the cooling plate 6 and downwardly by the plate 2 and on which one of the power components 5 is arranged. The intermediate plate 24 defines thereby with a section of a circumference 25 a recess which is a portion of the circumference of the opening 23 and the drain channel 12. Further, on the plate 24 cylindrical studs 26 (FIGS. 2 and 4, in FIG. 3 not illustrated) are formed which lie against the underside of the involved cooling plate 6 to avoid an upward bending of the plate 1. Therefore, the tubular conductors 17 simultaneously hinder a bending of the plate 2 upwardly and at the underside of the plate 2 cylindrical studs 27 (FIG. 2) formed thereon, which are not visible in FIGS. 3 and 4, hinder a downward bending of the plate 2. The plate 3 defines likewise the sides of the feed channel 13 by an edge 28 (FIGS. 2 and 5) and by rectangular shaped projections 31 on the bottom 30 of the recess. The inlet connector 14 is connected with the feed channel 13 by way of a hole 32 (FIGS. 2 and 5) in the intermediate plate 24 and the drain channel 12 is directly connected with the drain connector 15.

The cooling fluid flows in the direction of the illustrated flow arrows from the inlet connector 14 through the feed channel 13, distributes itself there by means of the opening 16 in the plate 2 and by means of the tubular conductors 17 in the outlet openings of the plate 1, is urged from there in substantially uniform distribution up to the underside of each cooling plate 6, and it then flows, with the taking away of heat and the accompanying cooling of the power components 5 through the drain outlets 10 in the plate 1 into the drain channel 12 and from there to the drain connector 15. The cooling device is very flat and thin, with the entire thickness of the plates 3, 21, and 24 being less than 10 mm. The plates 3, 21, and 24 preferably are made of heat insulating, thermoplastic material and are preferably sealingly connected with one another, so as to inhibit the escape of materials, for example by adhesive or welding. They can, however, also be made of metal. In both cases the cooling device can be made in a simple way. The number of the power components and accordingly of the distributing devices 4 is not limited to the illustrated number of six. They can be of greater or smaller number, and for example the number can also be only one.

Figure 6:
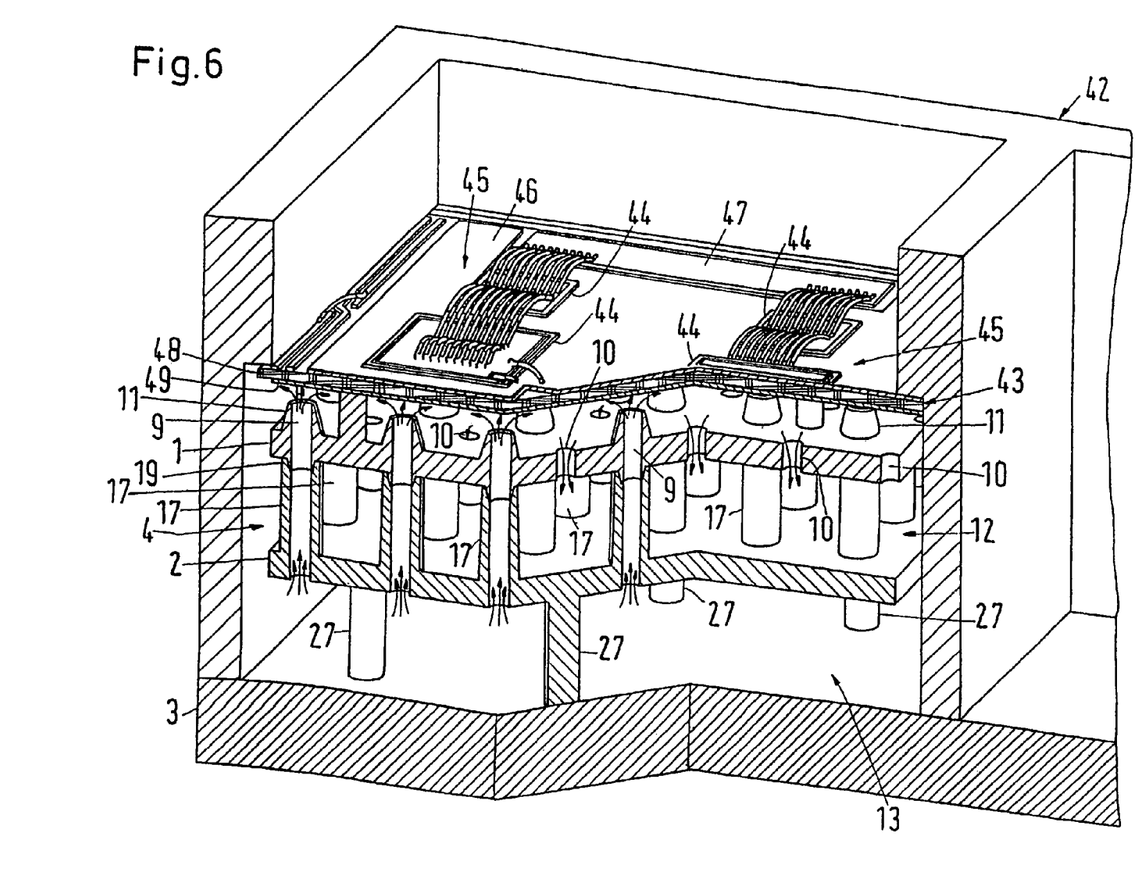
FIG. 6 is a perspective cross-section of a portion of a cooling device comprising a second embodiment the invention.

The embodiment according to FIG. 6 differs from that according to FIGS. 1 to 5 essentially only in that the distributing devices 4, of which only one is illustrated, are each arranged in its own chamber of a housing 42 and on the cooling plate 43 are fastened several power components 45, in this case two, having power semiconductor elements 44. The cooling plate 43 is relatively thin and consists in its middle of a layer 48 of electrically insulating ceramic material, such as AlSiC, with good heat conductivity, whose upper side has copper layers 46 and 47 for electric current supply and whose underside has a thin copper layer 49 to compensate for the different heat expansion coefficients of the layers 46, 47 and 48. The feeding and draining of the cooling fluid results again through non-illustrated input and drain connectors on the housing 42. The housing 42 is made of a heat insulating plastic. The plate 3 can be made of metal or plastic. The flow direction of the cooling fluid is again indicated by flow arrows.

Figure 7:
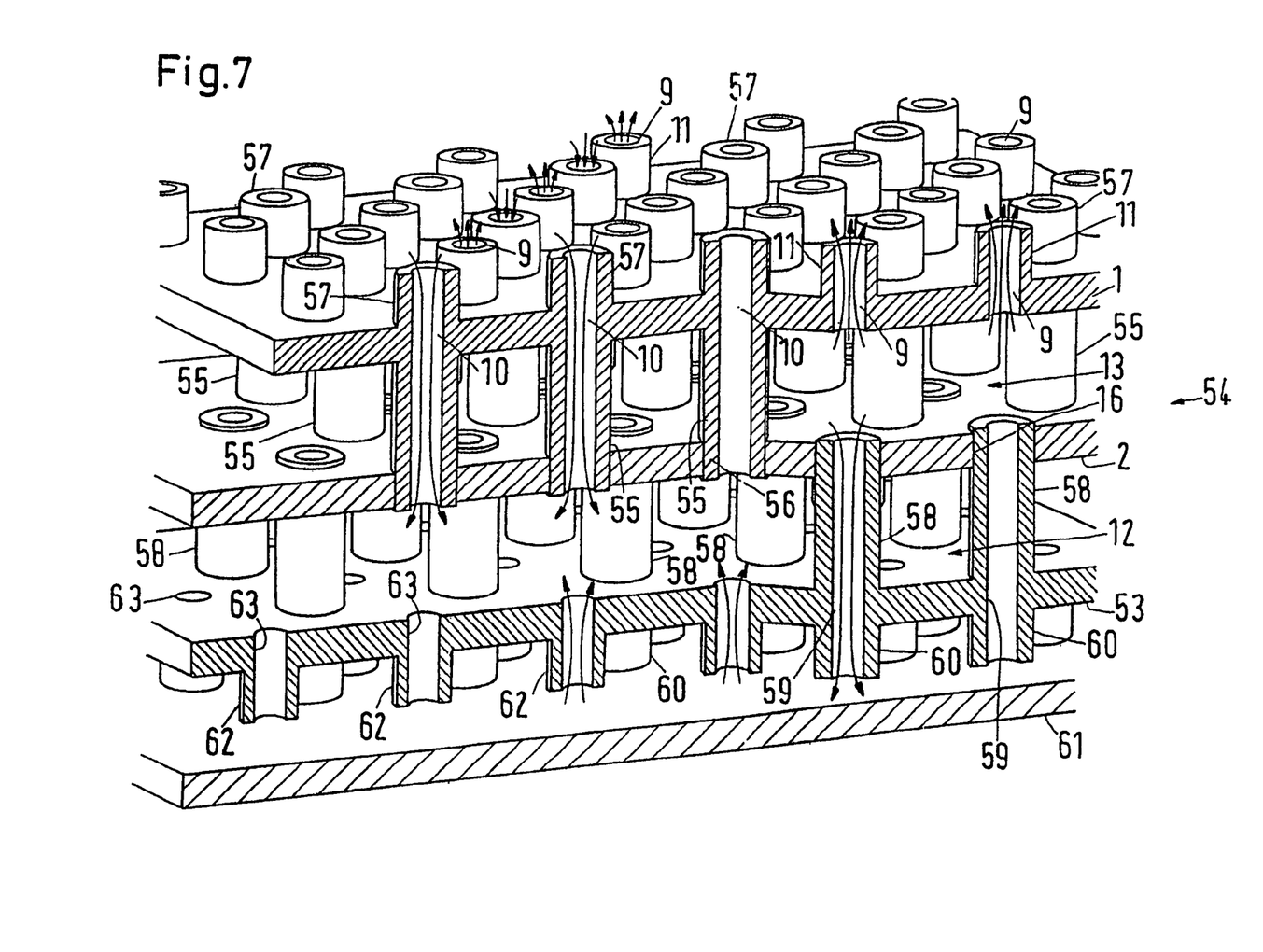
FIG. 7 is a view of a cooling fluid distributing device somewhat modified in comparison to the first and second exemplary embodiments.
Figure 8:
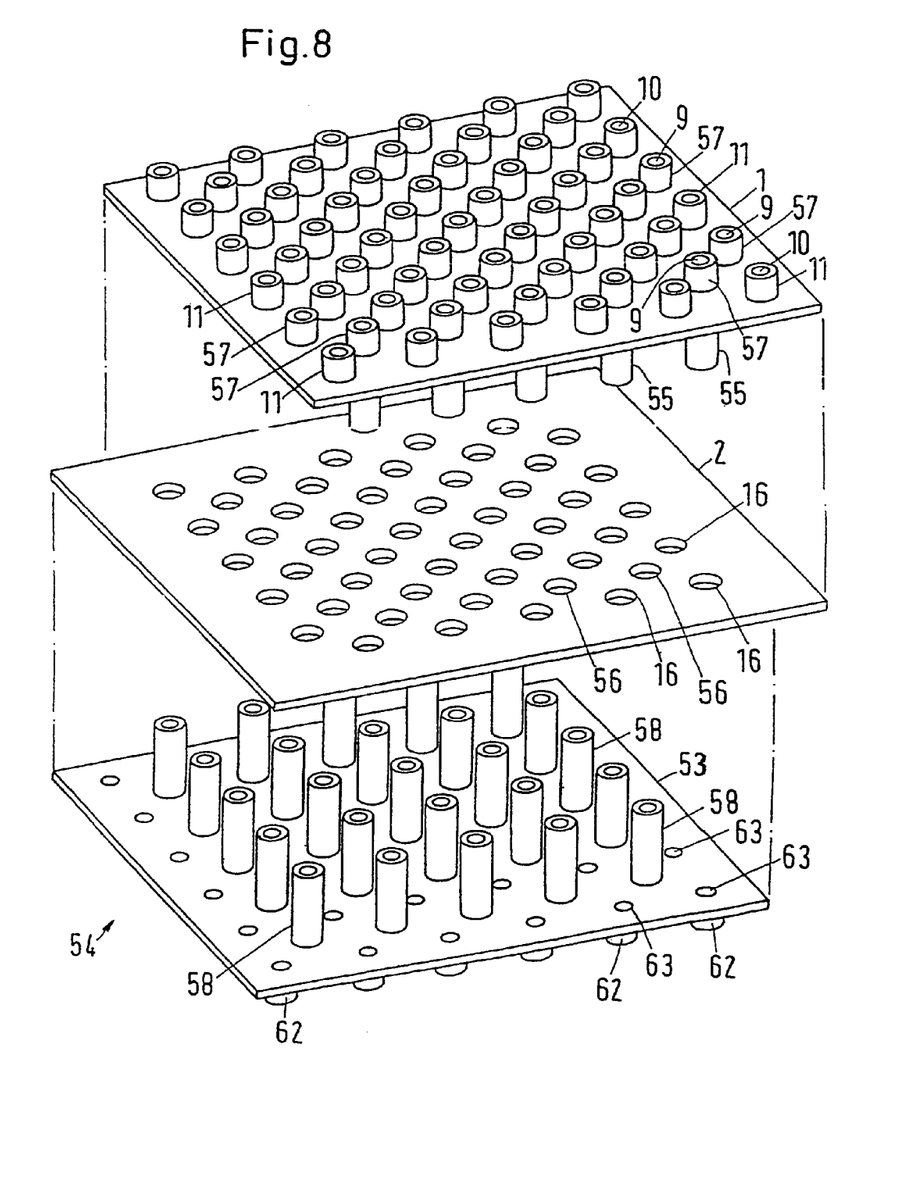
FIG. 8 is a perspective exploded view of the distributing device illustrated sectionally in FIG. 7.

FIG. 7 shows a section, and FIG. 8 an exploded view, of a modified distribution device 54 for the cooling fluid, which can also be used in the cooling device according to FIGS. 1–6 in place of the distributing device 54. In the case of the distributing device 54 according to FIG. 7 the tubular conductors 54 which pass through the feed channel 13 are formed as one piece with the first plate 1. The tubular conductors 55 serve for the draining of the cooling fluid out of the space between the cooling plate 6 (FIG. 2) not illustrated in FIG. 7 or the cooling plate 43 (FIG. 6) and the first plate 1 in the drain channel 12. In this case, the tubular conductors 55 are plugged into holes 56 in a second plate 2 and are preferably sealingly connected with those holes. Further, not only the outlet openings 9, but also the drainage openings 10 are connected to the side of the first plate 1 facing the non-illustrated cooling plate by stubs 11 and 57, each of which extends into the vicinity of the non-illustrated cooling plate, that is a spacing of the stubs from the cooling plate is maintained. In the openings 16 of the second plate 42 tubular conductors 58 are again provided, which pass through the drain channel 12 and are connected as one piece with the drainage opening 59 in the third plate 53. These drainage openings 59 are moreover connected as one piece with stubs 60 formed on the third plate 53. The stubs 60 extend downwardly into the vicinity of a second cooling plate 61 and direct cooling fluid delivered from the feed channel 13 through the tubular conductors 58 onto the second cooling plate 61. On the underside of the second cooling plate 61 further power components can be attached similarly to the power components 5 or 45. The cooling plate 61 can likewise be formed similarly to the cooling plate 6 or the cooling plate 43. The cooling fluid is turned around above the cooling plate 61 by stubs 62 formed of one piece with the third plate 53 which stubs connect with drain hole 63 in the third plate 53 which return the cooling fluid to the drainage channel 12. The flow direction of the cooling fluid is again indicated by flow arrows.

In the case of this embodiment of the distributing device 54 the total cooling surface is twice as large as that of the previous embodiments without essentially increasing the required space.

Figure 9:
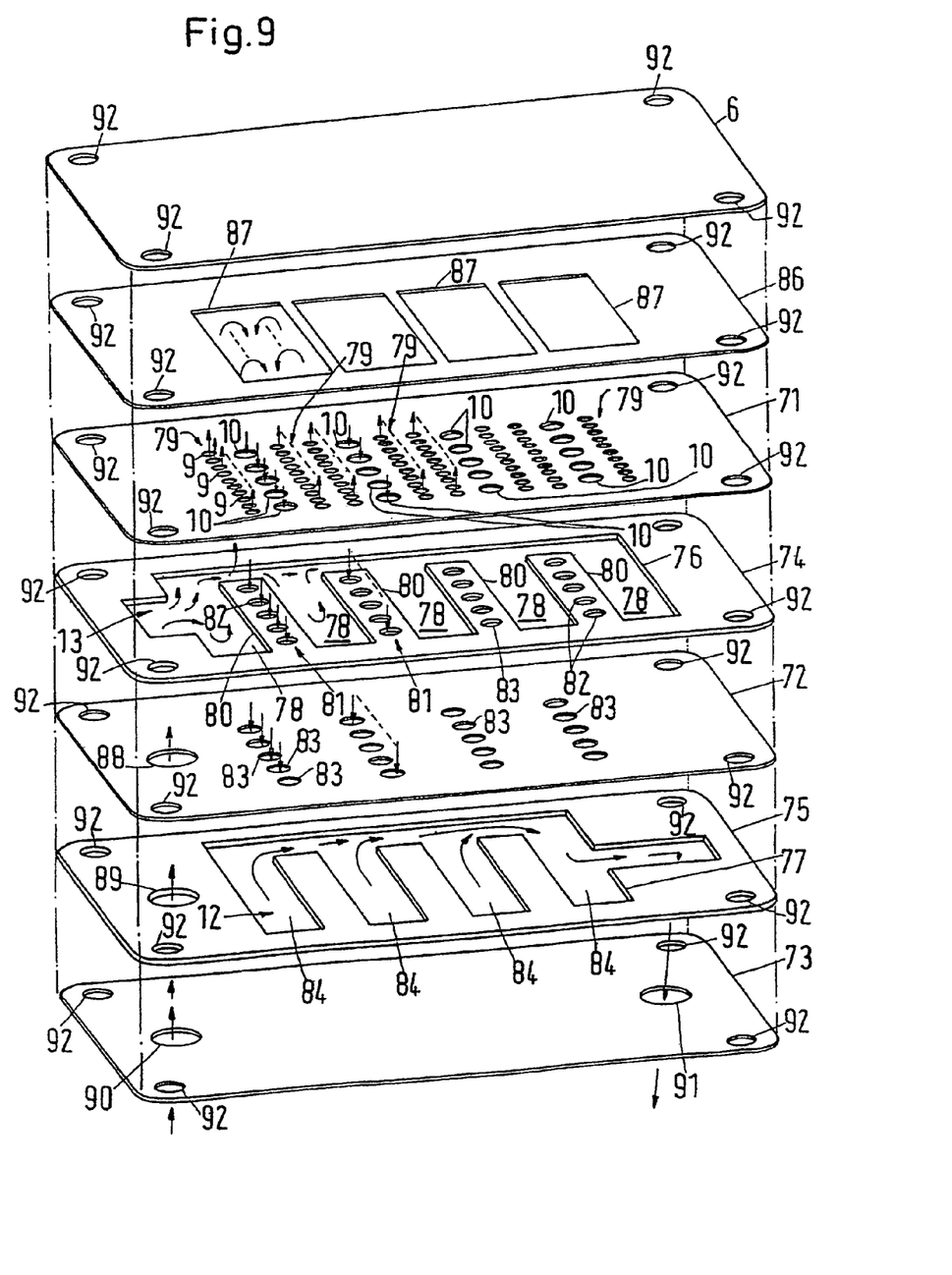
FIG. 9 is an exploded view of a cooling device comprising a further embodiment of the invention.

FIG. 9 illustrates a further embodiment of the invention which can form either a cooling portion of a cooling device or by itself a cooling device according to the invention. This cooling device or cooling part again includes a first plate 71, a second plate 72 and a third plate 73. Between the first plate 71 and the second plate 72, and lying on these, is a fourth plate 74. A somewhat cone shaped first aperture is formed in the fourth plate 74 which laterally defines the feed channel 13 while the plates 71 and 72 upwardly and downwardly respectively define the feed channel. Between the second plate 72 and the third plate 73, and lying on these, is a fifth plate 75, in which a second somewhat conelike aperture 77 is formed. This aperture 77 laterally defines the drain channel 12, while the plates 72 and 73 respectively upwardly and downwardly define that channel. Each comb toothlike branch 78 of the first aperture 76 has associated with it a group 79 of outlet openings 9 arranged in at least one row. Each tongue 80 of the fourth plate extending between neighboring branches 78 of the first aperture 76 contain a group 81 of drain openings 72, each which registers with a discharge opening 10 in the first plate 71 and a discharge opening 83 in the second plate 72. Each group of drain openings 73 lying in a row in the second plate is associated with a comb toothlike branch 84 of the second aperture 77.

Between the cooling plate 6 and the first plate 71, and lying on these, is a sixth plate 86 in which openings 87 are formed. By means of each of these openings 87 at least one group 79 of outlet openings 9, here two group 79 and one group of drain openings 10, here the group of drain openings 10 lying between two neighboring groups 79 of outlet openings, 9 standing in connection with the cooling plate 6. The first aperture 76 is, by means of mutually registering holes 88, 89, and 90 in the first, third, and fifth plates 72, 73, and 74, connected with a (non-illustrated) inlet connector; and a second aperture 77 by means of a hole 91 formed in the third plate 73 is connected with a (non-illustrated) outlet connector. The plates 6, 71–75 and 86 are all sealingly connected with one another, in this case by means of screws, which are inserted through holes 92 in the plates 6, 71 75, 86. Additionally or in place of this, the plates 6, 71–75, 86 can be adhesively connected or welded relative to one another.

The cooling plate 6 again is made of metal and can, however, also be made similarly to the cooling plate 43 in FIGS. 6.

The cooling part illustrated in FIG. 9 can again be used by itself or several can be enclosed in one housing and power components 5 to be cooled can be provided on the cooling plate 6 or a fluid to be cooled can be brought into contact with the cooling plate 6.

As a whole, the cooling part has a very flat, compact and simple to make construction, with the plates 71–75 and 86 all being able to be made from heat insulating thermoplastic plastic material. It is, however, also possible to make not only the cooling plate 6, but also the plate 86 and the plates 72, 73 and 75 or all of the plates 6, 71–75 and 86 of metal.

Figure 10:
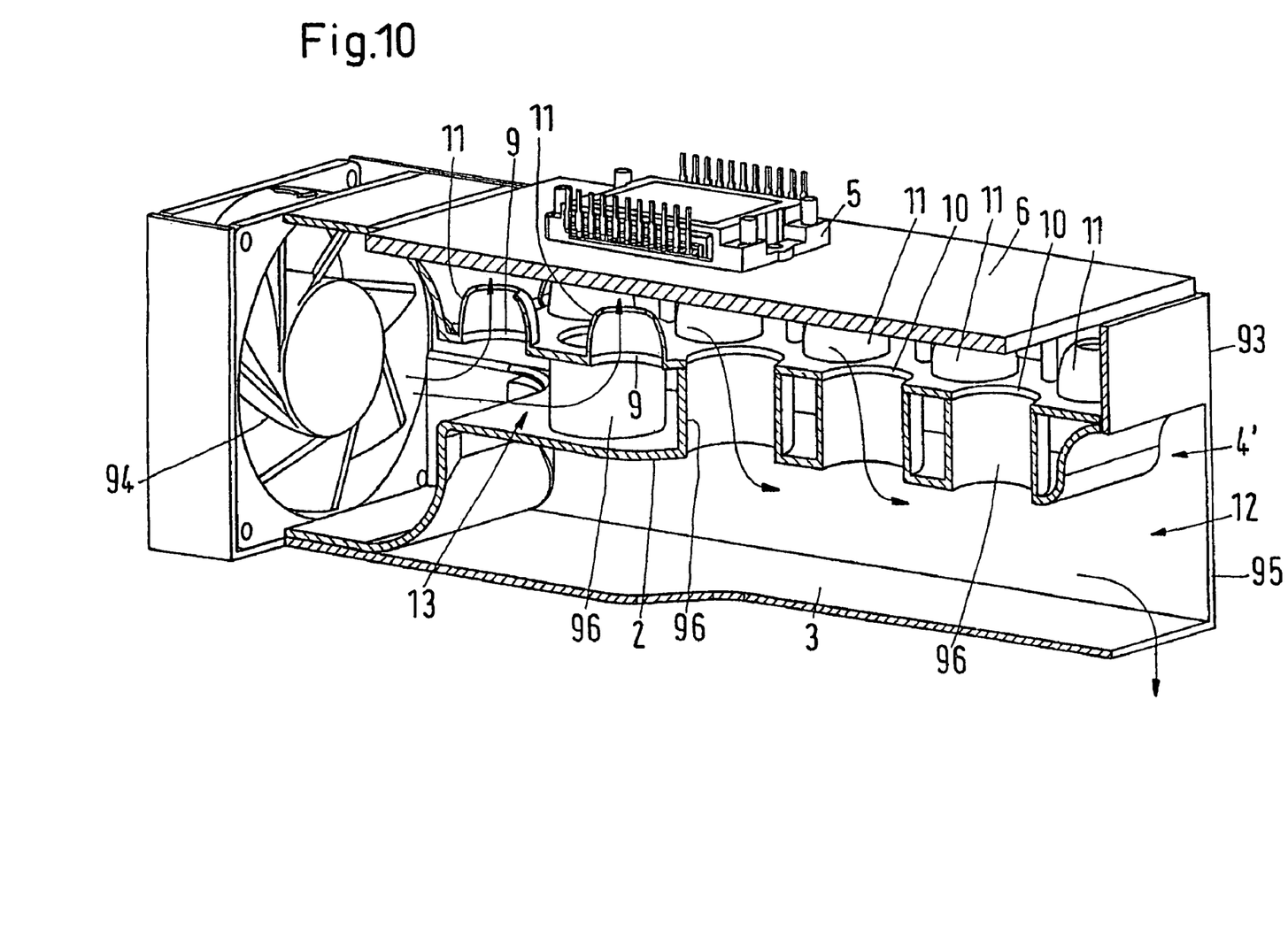
FIG. 10 is a perspective sectional view of a cooling device comprising a still further embodiment of the invention.

FIG. 10 illustrates a further embodiment of a cooling device made in accordance with the invention, in which on a cooling plate 6, which at the same time forms the cover plate of a housing 93, at least one electronic power component 5 is fastened. Beneath the cooling plate 6 is arranged a distributing device 4' which is largely similar to the distributing device 4 according to FIGS. 2 and 3—up to the exchange of the feed and drain channels and the therewith reversal of the flow direction. By means of a fan 94 air or another gas as a cooling fluid is blown at one end of the housing 93 into the feed channel 13 and over the drain channel 12 through an opening 95 at the other end of the housing 93 directly into the free environment. In this case the outlet openings 20 connect directly to the feed channel 13 while the drain openings 10 are connected to the drain channel 13 by through going tubular connectors 96. Principally in this case only the flow direction of the cooling fluid is reversed in contrast that according to the first exemplary embodiment.

The invention claimed is:

1. A cooling device comprising:
   a heat conducting cooling plate for the item or items to be cooled; and
   a platelike distributing device arranged in the vicinity of the cooling plate for a cooling fluid, said distributing device having, on a side facing the cooling plate, a plurality of outlet openings for the cooling fluid and at least one drain opening for the cooling fluid;
   wherein the distributing device has a first plate in which the outlet openings and a plurality of drain openings are uniformly distributed, a second plate and a third plate, which plates are superimposed relative to one another and of which two plates are such that one of said two plates bounds a feed channel connected with all of the outlet openings and one of said two plates bounds a drain channel connected with all of the drain openings, and wherein the outlet openings are arranged in spaced condition from the cooling plate and are directed toward the cooling plate.

2. The cooling device according to claim 1, wherein the feed channel is connected with the outlet openings through tubular conductors which pass through the drain channel, and the drain openings discharge directly into the drain channel.

3. The cooling device according to claim 2, wherein the second plate is arranged between the first plate and the third plate, and the tubular conductors are formed as one piece with the second plate.

4. The cooling device according to claim 3, wherein the tubular conductors are connected with the outlet openings by plug connections.

5. The cooling device according to claim 1, wherein the outlet openings are connected directly to the feed channel and the drain openings are connected with the drain channel by tubular conductors passing through the feed channel.

6. The cooling device according to claim 5, wherein the second plate is arranged between the first plate and the third plate, and the tubular conductors are formed as one piece with the first plate.

7. The cooling device according to claim 6, wherein the tubular conductors are connected with holes passing through the second plate by a plug connection.

8. The cooling device according to claim 2, wherein the first plate is received in an opening in a cover plate of a housing which opening is covered by the cooling plate, the second plate is received in an opening in an intermediate plate of the housing, and the third plate is formed by a bottom plate of the housing.

9. The cooling device according to claim 6, wherein the third plate is provided with outlet openings directed to a second cooling plate, which outlet openings are connected with the feed channel by tubular conductors passing through the second plate, and that the third plate has drain openings leading to the drain channel.

10. The cooling device according to claim 2, wherein each cooling plate is made of metal and at least the second plate and the third plate as well as the tubular conductors are made from heat insulating thermoplastic plastic material.

11. The cooling device according to claim 1, wherein between the first plate and the second plate a fourth plate is positioned which lies on the first and second plates, the fourth plate defining a first aperture which laterally bounds the feed channel, a fifth plate is positioned between the second plate and the third plate and lies on the second plate and the third plate the fifth plate defining a second aperture which laterally bounds the drain channel of the first aperture being further defined by toothlike branches each having associated therewith a group of outlet openings of the first plate, the fourth plate defining tongues located between neighboring branches of the first aperture each tongue having a group of drain openings, each drain opening registering with a drain opening in the first plate and a drain opening in the second plate, and that each group of drain openings of the second plate is associated with one of the branches of the second aperture.

12. The cooling device according to claim 11, wherein a sixth plate is positioned between the cooling plate and the first plate and lies on the cooling plate and the first plate, the sixth plate defining holes, and through each of said holes at least one of the groups of outlet openings and drain openings in the first plate stand in connection with the cooling plate.

13. The cooling device according to claim 11, wherein the first aperture is connected with an inlet connector through registering holes in the second, third and fifth plates and the second aperture is connected with an outlet connector through a hole in the third plate.

14. The cooling device according to claim 11, wherein the plates are sealingly connected with one another.

15. The cooling device according to claim 11, wherein at least the first to fifth plates are made of one of plastic and metal and the cooling plate is made of metal.

* * * * *